US011789843B1

(12) United States Patent
Cridge et al.

(10) Patent No.: US 11,789,843 B1
(45) Date of Patent: Oct. 17, 2023

(54) EVENT DETECTION SENSOR AND RECORDING SYSTEM

(71) Applicant: Cornerstone Research Group, Inc., Miamisburg, OH (US)

(72) Inventors: Mark Cridge, Miamisburg, OH (US); Trang T. Young, Dayton, OH (US); Matthew Benefiel, Xenia, OH (US); Mitchell Bauer, Beavercreek, OH (US); Gianfranco Trovato, Monroe, OH (US); Kristin M. Cable, Dayton, OH (US)

(73) Assignee: Cornerstone Research Group, Inc., Miamisburg, OH (US)

(*) Notice: Subject to any disclaimer, the term of this patent is extended or adjusted under 35 U.S.C. 154(b) by 508 days.

(21) Appl. No.: 16/918,504

(22) Filed: Jul. 1, 2020

Related U.S. Application Data

(60) Provisional application No. 62/870,881, filed on Jul. 5, 2019.

(51) Int. Cl.
| | |
|---|---|
| *G06F 11/30* | (2006.01) |
| *H05K 1/11* | (2006.01) |
| *H05K 1/18* | (2006.01) |
| *G06F 11/34* | (2006.01) |

(52) U.S. Cl.
CPC ........ *G06F 11/3089* (2013.01); *G06F 11/3072* (2013.01); *G06F 11/3476* (2013.01); *H05K 1/118* (2013.01); *H05K 1/185* (2013.01); *G06F 2201/86* (2013.01)

(58) Field of Classification Search
None
See application file for complete search history.

(56) References Cited

U.S. PATENT DOCUMENTS

| | | | | |
|---|---|---|---|---|
| 9,861,151 | B2* | 1/2018 | Ciaramelletti et al. | ..................... A61B 5/6801 |
| 10,198,879 | B2* | 2/2019 | Wright | .................. G07C 5/008 |
| 2015/0285832 | A1* | 10/2015 | Thomas et al. | ....... G01L 5/0052 702/145 |
| 2016/0150195 | A1* | 5/2016 | Good et al. | ............ H04N 7/188 348/143 |

(Continued)

FOREIGN PATENT DOCUMENTS

| | | | |
|---|---|---|---|
| CA | 3030958 | C | 1/2017 |
| WO | 2015164389 | A1 | 10/2015 |

(Continued)

OTHER PUBLICATIONS

"Surveillance Station" Synology Support Center, 8 pgs.

*Primary Examiner* — Isaac Tuku Tecklu
(74) *Attorney, Agent, or Firm* — DINSMORE & SHOHL LLP

(57) ABSTRACT

A method of detecting an event and recording quantitative parameters associated with the event is provided. The method includes securing an event detection and recording system on a piece of equipment, the event detection and recording system comprising a plurality of sensors, an internal power source, and a microcontroller. The method further includes activating a low monitoring mode and measuring one or more quantitative parameters with the one or more of the sensors at a first sampling rate to generate low monitoring mode sensor data; analyzing the low monitoring mode sensor data to detect initiation of a triggering event; terminating the low monitoring mode upon detection of the triggering event; and activating a high monitoring mode including measuring and recording one or more quantitative parameters at a second sampling rate, where the second sampling rate is greater than the first sampling rate. The associated system is also provided.

23 Claims, 8 Drawing Sheets

(56) References Cited

U.S. PATENT DOCUMENTS

| | | | | |
|---|---|---|---|---|
| 2016/0171864 A1* | 6/2016 | Ciaramelletti et al. | A42B 3/046 |
| | | | 340/539.11 |
| 2017/0006950 A1* | 1/2017 | Miller, II | .............. A61B 5/4064 |
| 2020/0103841 A1* | 4/2020 | Pillai et al. | .......... G05B 19/048 |
| 2020/0365265 A1* | 11/2020 | Brosnan et al. | ....... G16H 40/63 |

FOREIGN PATENT DOCUMENTS

WO  2017011814 A1  1/2017

* cited by examiner

US 11,789,843 B1

EVENT DETECTION SENSOR AND RECORDING SYSTEM

CROSS-REFERENCE TO RELATED APPLICATIONS

This application claims priority to U.S. Provisional Application 62/870,881, filed Jul. 5, 2019, which is incorporated by reference herein in its entirety.

STATEMENT REGARDING FEDERALLY SPONSORED RESEARCH OR DEVELOPMENT

This invention was made with U.S. Government support under Contract No. FA8650-18-P-6945 and FA8650-19-C-6101 awarded by U.S. Air Force Research Laboratory to Cornerstone Research Group Inc. The U.S. Government has certain rights in the invention.

TECHNICAL FIELD

Embodiments of the present disclosure generally relate to event detection sensor and recording systems and associate methods of detecting an event and recording quantitative parameters associated with the event utilizing the same.

BACKGROUND

Military and athletic activities include potential exposure to high acceleration or other traumatic forces in the course of their performance. For example, fighter pilots may be required to eject from an incapacitated plane, American football players routinely experience jolting hits in the course of play, and auto racing drivers frequently are subject to traumatic crashes. Attempts have been made to quantify the accelerations and traumatic forces experienced, but each such incident is unique in view of the surrounding circumstances. Existing systems to monitor these incidents process and potentially store enormous amounts of data with respect to the actual events of interest. These systems do not intelligently confirm events using other information to determine if the appropriate information is being gathered and recorded. Hence, such detection systems are subject to increased requirements for power, memory, and bandwidth by capturing, storing, and potentially transferring non-event related data to ensure sufficient capture of the relevant data. In the scenarios of event detection with wearable or portable sensor systems, the availability of power is even more limited given the weight and space constraints.

SUMMARY

As such, there are needs for event detection and monitoring systems which provide prolonged operational readiness and reduced power consumption with improvements in both the event triggered recording and data storage processes. The present disclosure provides a wearable event detection and recording system that actively monitors one or more parameters which are indicative of initiation of the event of concern, such that full-scale acquisition and recording of data may be undertaken only during periods of interest. The event detection and recording system additionally includes schemes to ensure relevant data before, during, and after the event of concern are retained and available for analysis at a later time.

Embodiments of the present disclosure relate to a method of detecting an event and recording quantitative parameters associated with the event. The method of detecting an event and recording quantitative parameters associated with the event includes securing an event detection and recording system on a piece of equipment, including an article of personal protective equipment, the event detection and recording system comprising an event sensor, at least one activity sensor, a buffer memory, a data storage module, an internal power source, and a microcontroller. The method further includes activating a low monitoring mode upon determination that the event detection and recording system has been placed into service, the low monitoring mode comprising measuring one or more quantitative parameters with the activity recording sensor, the event sensor, or both the activity recording sensor and the event sensor at a first sampling rate to generate low monitoring mode sensor data, wherein a sampling rate represents the temporal frequency of measurements and recording the low monitoring mode sensor data in the buffer memory. The method further includes analyzing the low monitoring mode sensor data with the microcontroller to detect initiation of a triggering event, where initiation of the triggering event is determined by comparing one or more measurements from the low monitoring sensor data with a predefined data set indicative of the triggering event and activating a high monitoring mode upon detection of the triggering event, the high monitoring mode comprising measuring one or more quantitative parameters with the activity recording sensor, the event sensor, or both the activity recording sensor and the event sensor at a second sampling rate to generate high monitoring mode sensor data, where the second sampling rate is greater than the first sampling rate. The method further includes terminating the low monitoring mode and transferring the low monitoring mode sensor data to the data storage module upon detection of the triggering event and recording the high monitoring mode sensor data to the data storage module. Further, the buffer memory is periodically overwritten until detection of the event, the data storage module comprises non-volatile memory, and the event detection and recording system is powered by the internal power source.

Embodiments of the present disclosure relate to an event detection and recording system. The event detection and recording system includes an event sensor configured to detect initiation of a triggering event; at least one activity recording sensor configured to measure one or more quantitative parameters during the event; a buffer memory configured to record an output of the event sensor, the activity recording sensor, or both the activity recording sensor and the event sensor, where the buffer memory is periodically overwritten until detection of the triggering event; a data storage module configured to record and store the output of the event sensor and the activity recording sensor, the data storage module comprising non-volatile memory; at least one data transfer module configured for transmission of data stored in the buffer memory, the data storage module, or both the buffer memory and data storage module to an external storage device; an internal power source; and a microcontroller coupled to the event sensor, the activity recording sensor, the buffer memory, the data storage module, and the data transfer module. The microcontroller configured to: collect the output of the event sensor and the activity recording sensor as sensor values; monitor the sensor values from the event sensor and determine initiation of the triggering event based on an analysis of the sensor values from the event sensor against reference values stored in the microcontroller; adjust the sampling rate and power consumption of the event sensor, the activity recording sensor, or both the event sensor and the activity recording sensor based on the monitored sensor values, wherein the sampling rate represents the temporal frequency of measurements; and transfer the sensor values stored in the buffer memory to the data storage module upon determination of initiation of the triggering event and initiate ongoing recordation of the sensor values to the data storage module to retain sensor values before, during, and after the triggering event. Further, the event sensor, the activity recording sensor, the buffer memory, the data storage module, the data transfer module, the internal power source, and the microcontroller are disposed in a housing.

BRIEF DESCRIPTION OF THE DRAWINGS

The following detailed description of specific embodiments of the present disclosure can be best understood when read in conjunction with the following drawings, in which.

DETAILED DESCRIPTION

Figure 1:
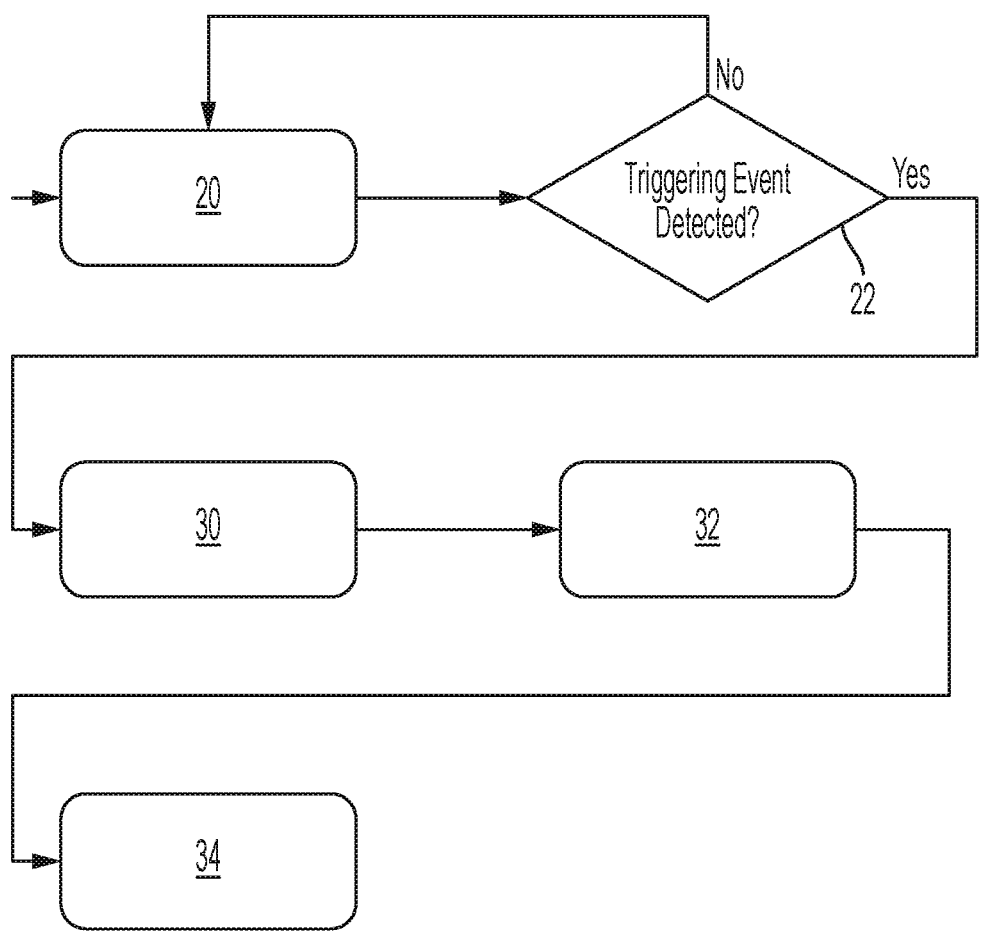
FIG. 1 is a flow chart of a method of detecting an event and recording quantitative parameters associated with the event in accordance with one or more embodiments of the present disclosure.
Figure 2:
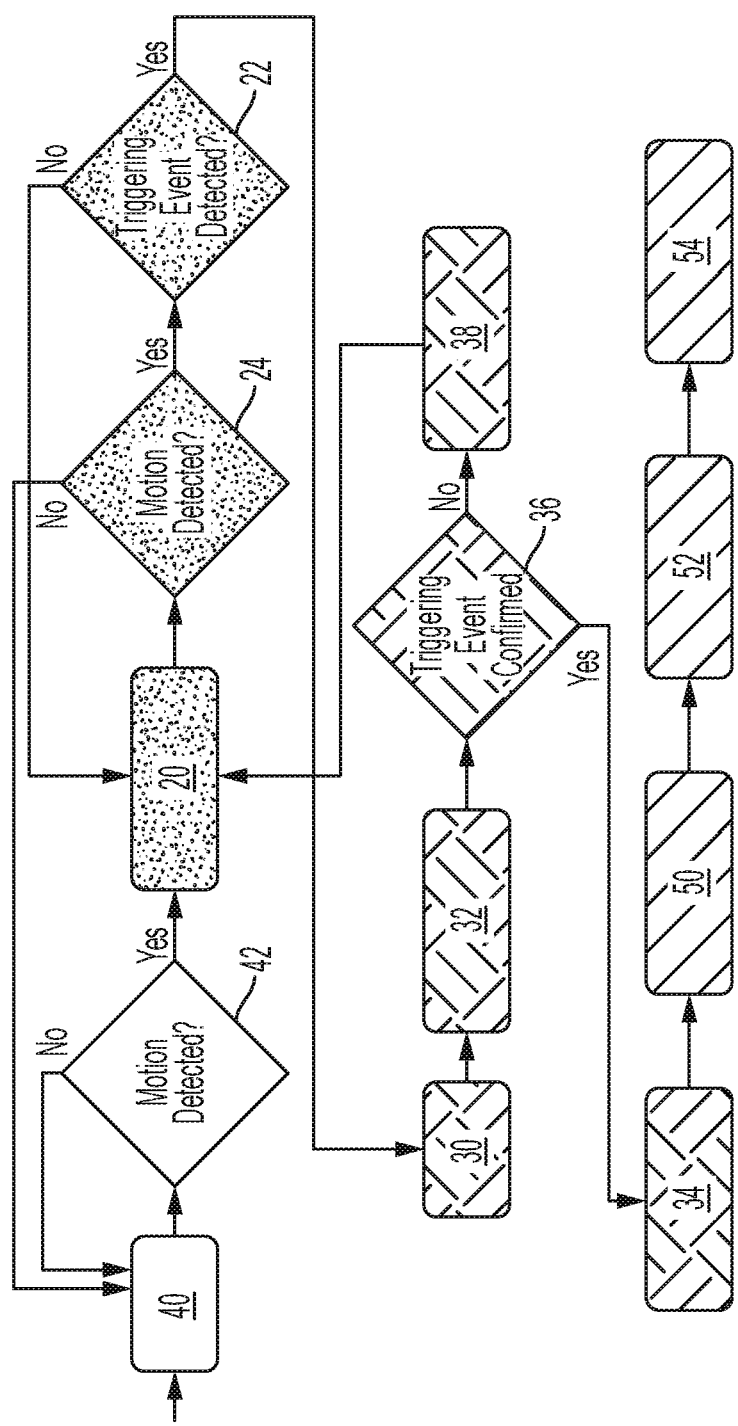
FIG. 2 is a flow chart of a method of detecting an event and recording quantitative parameters associated with the event in accordance with one or more embodiments of the present disclosure.
Figure 3A:
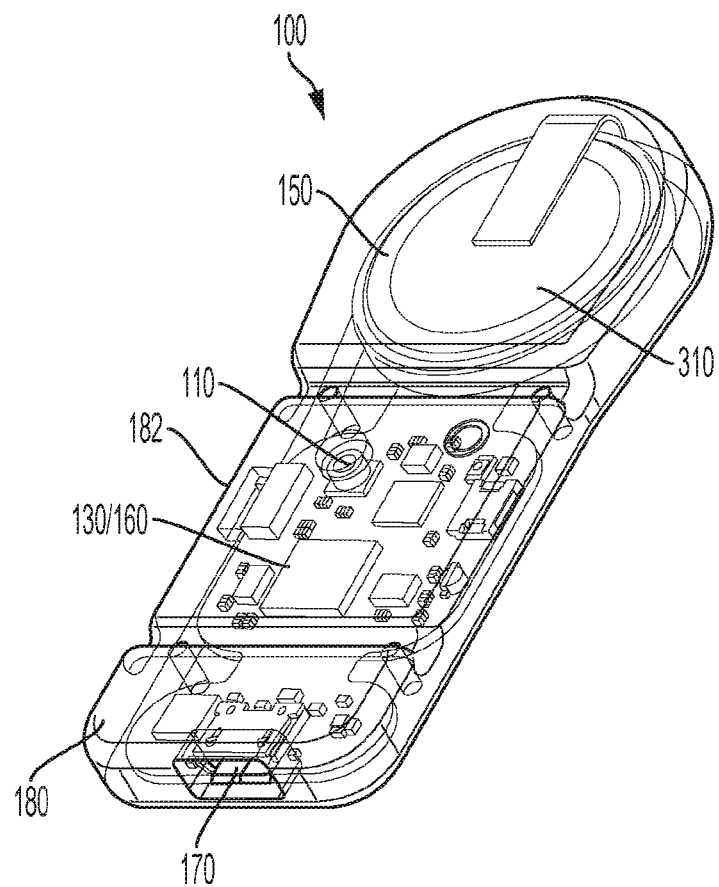
FIG. 3A is an illustration of an event detection and recording system with a flexible circuit board affixed to one or more rigid backing panels in accordance with one or more embodiments of the present disclosure.
Figure 3B:
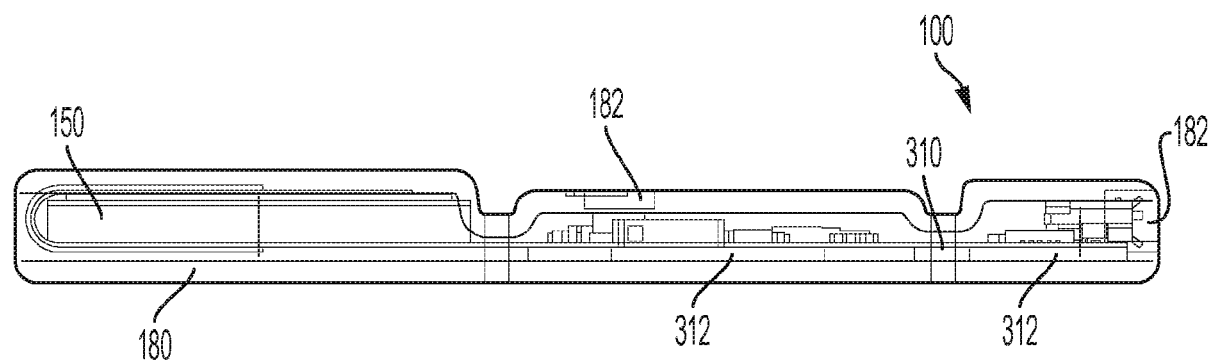
FIG. 3B is a side view of the event detection and recording system illustrated in FIG. 3A.
Figures 4A, 4B:
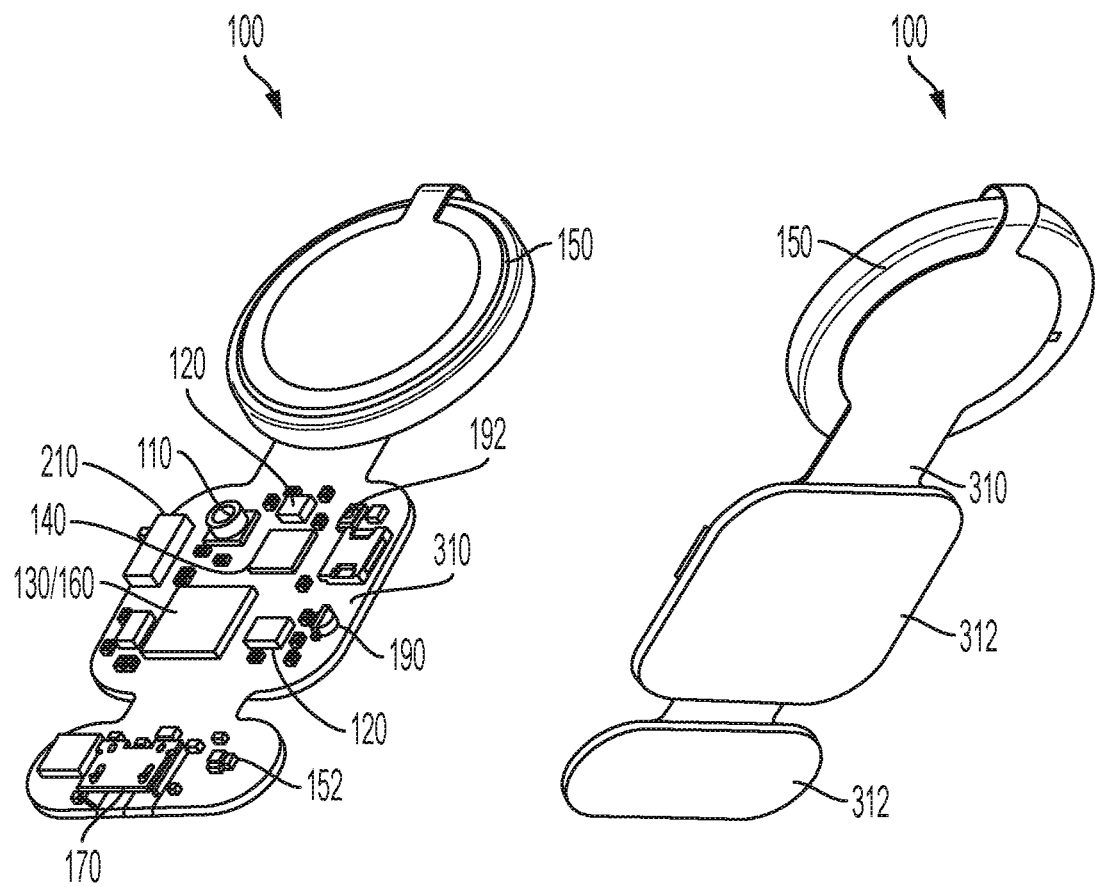
FIG. 4A is an illustration of an unencapsulated event detection and recording system of FIG. 3A in accordance with one or more embodiments of the present disclosure.
FIG. 4B is an illustration of the opposing side of FIG. 4A.

Embodiments of the present disclosure generally relate to methods of detecting an event and recording quantitative parameters associated with the event and event detection sensor and recording systems utilized in performance of the disclosed methods. The event detection sensor and recording systems leverages ultra-low power and miniaturized components with optimized low-power circuitry to gather quantitative parameters associated with an event of interest. The sensor system captures data before, during, and after the event of interest at data sampling rates adjusted to efficiently and adequately capture the quantitative parameters to analyze the complete event of interest. For high impact and short duration events, such as a pilot ejection from a fighter aircraft, it is significant to monitor and retain qualitative parameters for a time period prior to initiation of the event. Collection and retention of data prior to detection of the event allows for information about the activity of interest, such as movement or acceleration of a pilot, to be studied as well as reduces the risk of delay in the detection and trigger of data recording, thereby missing the entirety or relevant portions of the activity during the event.

In accordance with embodiments of a method of detecting an event and recording quantitative parameters associated with the event and with reference to FIGS. 1-5 and 8-9, the method comprises securing an event detection and recording system 100 on a piece of equipment, including an article of personal protective equipment 200, the event detection and recording system 100 comprising an event sensor 110, at least one activity sensor 120, a buffer memory 130, a data storage module 140, an internal power source 150, and a microcontroller 160. Further, the method includes activating a low monitoring mode 20 upon determination that the event detection and recording system 100 has been placed into service, the low monitoring mode 20 comprising measuring one or more quantitative parameters with the activity recording sensor 120, the event sensor 110, or both the activity recording sensor 120 and the event sensor 110 at a first sampling rate to generate low monitoring mode sensor data; recording the low monitoring mode sensor data in the buffer memory 130; analyzing the low monitoring mode sensor data with the microcontroller 160 to detect initiation of a triggering event; and activating a high monitoring mode 30 upon detection of the triggering event, the high monitoring mode 30 comprising measuring one or more quantitative parameters with the activity recording sensor 120, the event sensor 110, or both the activity recording sensor 120 and the event sensor 110 at a second sampling rate to generate high monitoring mode sensor data. The method additionally includes terminating the low monitoring mode 20 and transferring the low monitoring mode sensor data to the data storage module 140 upon detection of the triggering event and further recording the incoming high monitoring mode sensor data to the data storage module 140. It will be appreciated that in accordance with one or more embodiments, the event detection and recording system 100 is powered by the internal power source 150 without the need for a power source external to the envelope of the system 100.

The event detection and recording system 100 includes a plurality of sensors for measurement of the quantitative parameters and detection of the event. For ease of understanding and clarity regarding function of each sensor disclosed throughout the present disclosure, such sensors have been classified as activity sensors 120 and event sensors 110. The event sensor 110 is configured to detect initiation of the triggering event. The activity recording sensor 120 is configured to measure one or more quantitative parameters before, during, and/or after the event. It will be appreciated that one or both of the activity sensor 120 and the event sensor 110 may be active and acquiring measurements during each phase of the method of detecting an event and recording quantitative parameters associated with the event.

Having generally described embodiments of methods of detecting an event and recording quantitative parameters associated with the event in accordance with the present disclosure, further detail and additional embodiments will be provided.

Figure 6:
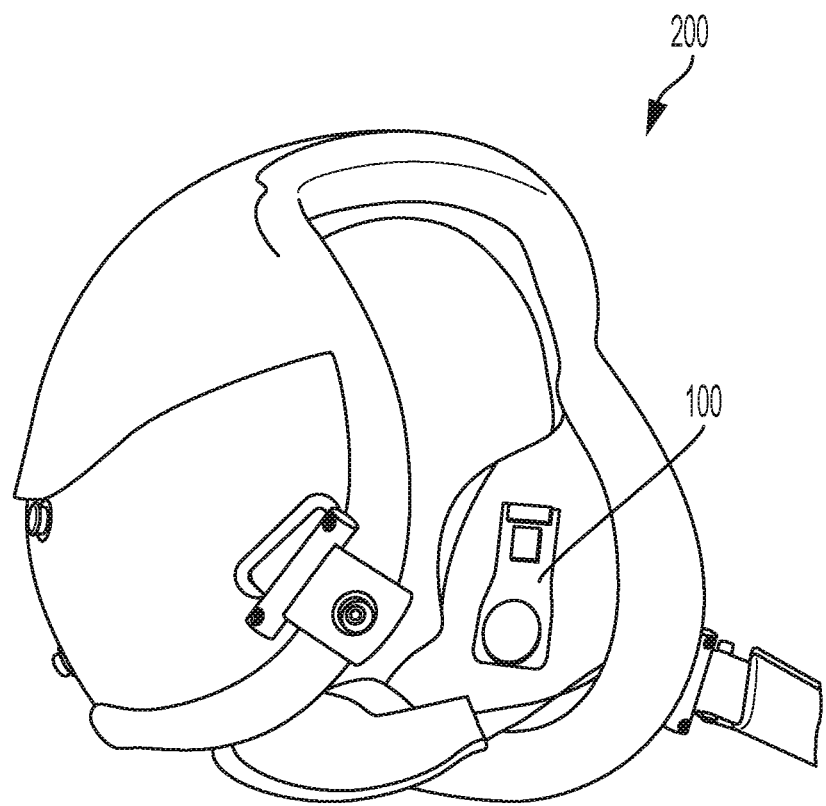
FIG. 6 is an illustration of an event detection and recording system in accordance with one or more embodiments of the present disclosure positioned in a pilot helmet.

The event detection and recording system 100 may be secured on a piece of equipment, including an article of personal protective equipment 200, to provide quantitative data reflective of the environment and forces experienced by the wearer of the personal protective equipment 200. In various, the piece of equipment may be an article of personal protective equipment 200, a vehicle, a seat, or other component of a vehicle. In one or more embodiments, the personal protective equipment 200 may be a helmet such as worn by an athlete for various activities including football, auto racing, biking, hockey, horseback riding, skiing, or snowboarding. In further embodiments, the personal protective equipment 200 may be an article of the flight gear for a fighter pilot or astronaut such as a helmet, an oxygen mask, or a flight suit. The type of personal protective equipment 200 may be selected to position the event detection and recording system 100 at a particular location on the wearer's body in view of the type of event anticipated to be recorded as well as the commensurate forces experienced by the wearer of the personal protective equipment 200. Further, the personal protective equipment 200 and particular location of fixation of the event detection and recording system 100 thereto may be selected to minimize interference or discomfort of the wearer with the presence of the event detection and recording system 100. With reference to FIG. 6, a helmet used by a fighter pilot is illustrated with the event detection and recording sensor system 100 positioned on the interior of the helmet near the ear of the pilot. The system 100 would be covered by the ear cup insert of the helmet such that the pilot should not notice the system 100 once in place. It will be appreciated that description has been generally made to application of the event detection and recording sensor system 100 to helmets for conciseness throughout the present disclosure, the system 100 could be attached to other personal protective equipment 200 to monitor legs, arms, spine, or other point on a human body.

In one or more embodiments, the low monitoring mode 20 is activated upon determination that the event detection and recording system 100 has been placed into service. The low monitoring mode 20 comprises measuring one or more quantitative parameters with the activity recording sensor 120, the event sensor 110, or both the activity recording sensor 120 and the event sensor 110 at a first sampling rate to generate low monitoring mode sensor data. It will be appreciated that for purposes of the present disclosure, the term "sampling rate" represents the temporal frequency of measurements as understood by those skilled in the art.

The event detection and recording system 100 is considered placed into service when it is desired for active monitoring to occur. Specifically, active monitoring by the event detection and recording system 100 may be desired once the wearer of the personal protective equipment 200 has donned such personal protective equipment 200 in anticipation of starting the activity to be monitored. For example, a fighter pilot may remove their helmet from their storage locker prior to walking to their aircraft, at which point active monitoring of the quantitative parameters may be initiated. In one or more embodiments, determination that the event detection and recording system 100 has been placed into service may be made with manual switching on of the event detection and recording system 100. In one or more further embodiments, the event detection and recording system 100 may comprise hardware and/or programming to automatically sense, such as by sensing movement or displacement, when the personal protective equipment 200 is transitioned from an unused state to a state of active use such that that event detection and recording system 100 and the personal protective equipment 200 have been placed into service. Such transition may comprise operation of the event detection and recording system 100 in a deep sleep mode 40 during periods where the personal protective equipment 200 is unused, such deep sleep mode 40 disclosed in greater detail infra.

In one or more embodiments, during the low monitoring mode 20 the event sensor 110 is active to measure one or more quantitative parameters at the first sampling rate. The activity recording sensor 120 may be active or inactive during the low monitoring mode 20 in the various embodiments and may operate at a differing sampling rate than the event sensor 110.

In the low rate monitoring mode 20, the low rate monitoring mode sensor data is recorded in the buffer memory 130. The buffer memory 130 represents a computer hardware component which records the data stream of the low rate monitoring mode sensor data provided from the activity recording sensor 120, the event sensor 110, or both the activity recording sensor 120 and the event sensor 110. The buffer memory 130 may be periodically overwritten until detection of the event, and as such may record a constantly changing set of data. It will be appreciated that periodically overwriting the buffer memory 130 may include a circumstance where continuous overwriting occurs. In one or more embodiments, the oldest data may be discarded and overwritten as memory space is required for newly input date in a first-in, first-out manner. In further embodiments, the overwriting of recorded data in the buffer memory 130 may be completed in a more complex manner with retention of differing timespans of each quantitative parameter within the low rate monitoring mode sensor data. For example, 15 minutes of pressure data may be retained before overwriting whereas 5 minutes of acceleration data is retained before overwriting. It will be appreciated that the specific timespans and quantitative parameters may vary and can be selected to document the relevant periods for a specific activity or anticipated event associated with the field of implementation of the event detection and recording system.

The method of detecting an event and recording quantitative parameters associated with the event may comprise analyzing the low monitoring mode sensor data with the microcontroller to detect initiation of a triggering event 22. The triggering event represents an occurrence which warrants recording and saving the quantitative data for post-event analysis. For example, the ejection of a pilot from a fighter jet may be a triggering event. It is appreciated that the speed of a pilot ejection and any subsequent pilot movements in the air places a high degree of strain on the human body which is desirable to be able to review. In one or more embodiments, initiation of the triggering event 22 may be determined by comparing one or more measurements from the low monitoring sensor data with a predefined data set indicative of the triggering event. The comparison of the predefined data set indicative of the triggering event of interest and the continuous inflow of low monitoring sensor data may be handled by the microcontroller 160 in which a determination of the presence of the triggering event 22 may be made.

Upon detection of the triggering event 22, the high monitoring mode 30 is activated. The high monitoring mode 30 comprises measuring one or more quantitative parameters with the activity recording sensor 120, the event sensor 110, or both the activity recording sensor 120 and the event sensor 110 at a second sampling rate to generate high monitoring mode sensor data. The second sampling rate is greater than the first sampling rate utilized for collection of the low monitoring mode sensor data in order to capture the critical information regarding the activities immediately after the event in greater detail. In one or more embodiments, during the high monitoring mode 30, the activity recording sensor 120 is active to measure one or more quantitative parameters at the second sampling rate. The event sensor 110 may be active or inactive during the high monitoring mode 30 in the various embodiments and may operate at a differing sampling rate than the activity recording sensor 120.

In one or more embodiments, the high monitoring mode sensor data is recorded to the data storage module 140 for retention. The recording of the high monitoring mode sensor data to the data storage module 140 may continue until completion of the event 34. Additionally, upon detection of the triggering event 22 and the concurrent activation of the high monitoring mode 30, the low monitoring mode 20 is terminated and the low monitoring mode sensor data stored within the buffer memory 130 is transferred to the data storage module 140 for retention. Specifically, the low monitoring mode sensor data stored within the buffer memory 130 is stored as pretriggering event data 32. The data storage module 140 comprises non-volatile memory configured to record the data transferred from the buffer memory 130 as well as the stream of high monitoring mode sensor data for subsequent analysis. The data storage module 140 is formed from nonvolatile memory to allow for retention of the stored data in the event of complete loss or depletion of the internal power source 150.

The sampling rate of the various sensors in the high monitoring mode 30 and the low monitoring mode 20 may vary based on one or more of the type of sensor, the application for the event detection and recording system 100, or other parameters which might be appreciated by one skilled in the art. For example, in the low monitoring mode 20 an acceleration or gyroscopic sensor may have a sampling rate of 50 to 200 hertz (Hz) representing 50 to 200 samples per second, 75 to 150 Hz, or approximately 100 Hz. Similarly, in the high monitoring mode 30 an acceleration or gyroscopic sensor may have a sampling rate of 500 to 1500 Hz, 750 to 1250 Hz, or approximately 1000 Hz to capture more frequent data points. With regards to a pressure sensor, the low monitoring mode 20 may capture data at a frequency of 100 to 500 Hz, 200 to 450 Hz, or 300 to 400 Hz. Similarly, the high monitoring mode 30 may capture data from a pressure sensor at a frequency of 1/60 to 500 Hz, 100 to 500 Hz, or 300 to 400 Hz dependent on the applicability of pressure data after the triggering event 22.

In one or more embodiments, the method further comprises measuring one or more quantitative parameters with the activity recording sensor 120, the event sensor 110, or both the activity recording sensor 120 and the event sensor 110 at a third sampling rate to generate sleep mode sensor data in the deep sleep mode 40. It will be appreciated that the first sampling rate utilized for collection of the low monitoring mode sensor data is greater than the third sampling rate utilized for the collection of the sleep mode sensor data. During the deep sleep mode 40 previously disclosed, the event detection and recording system 110 may operate at the third sampling rate to conserve power within the internal power source 150 by significantly reducing the frequency of data acquisition. For example, the first sampling rate utilized in the low monitoring mode 20 may comprise a sampling rate of 100 Hz in contrast to the third sampling rate utilized in deep sleep mode 40 which may comprise a sampling rate of once every 30 seconds (1/30 Hz). Such example represents a 3000-fold reduction in sample frequency. Additionally, during deep sleep mode 40 only specifically selected sensors may be operated to further reduce the total power consumption.

In one or more embodiments, the sleep mode sensor data may be analyzed with the microcontroller 160 to determine the event detection and recording system 100 has been placed into service. For example, in deep sleep mode, an accelerometer within the activity recording sensor 120 may be active and operated at the third sampling rate allowing the microcontroller 160 to determine when a pilot or athlete removes their helmet from their locker. In other embodiments, the accelerometer may allow the microcontroller 160 to determine when a pilot or racecar driver accelerates for a take-off or start of a race, thereby triggering an indication of the event detection and recording system 100 being placed into service and a transition to operation under the low monitoring mode 20. In each case, the microcontroller 160 is analyzing the sleep mode sensor data for detection of motion 42. In one or more embodiments, the event sensor 110 may be wholly inactive in the deep sleep mode 40 to conserve power reserves during periods when the event detection and recording system 100 has not been placed into service. As the event sensor 110 is configured to detect initiation of the triggering event 22, the output from the event sensor 110 may not be relevant or necessary during the deep sleep mode 40.

In one or more embodiments, the method further comprises activating a post-event monitoring mode 50 at a predetermined timeframe subsequent to the triggering event. The post-event monitoring mode 50 may comprise measuring one or more quantitative parameters with the activity recording sensor 120, the event sensor 110, or both the activity recording sensor 120 and the event sensor 110 at a fourth sampling rate to generate post-event monitoring mode sensor data. In one or more embodiments, the fourth sampling rate utilized for collection of the post-event monitoring mode sensor data may be intermediate the first sampling rate utilized for collection of the low monitoring mode sensor data and the second sampling rate utilized for the collection of the high monitoring sensor data. In further embodiments, the fourth sampling rate utilized for collection of the post-event monitoring mode sensor data may be intermediate the first sampling rate utilized for collection of the low monitoring mode sensor data and the third sampling rate utilized for the collection of the sleep mode sensor data. It will be appreciated that the post-event monitoring mode sensor data may be recorded to the data storage module 140 in step 52 of FIG. 2.

Reducing the sampling rate of the post-event monitoring mode 50 as compared to the high monitoring mode 30 allows for extended recording of relevant sensor data before depletion of the internal power source 150 or depletion of storage capacity within the data storage module 140. It will be appreciated that the magnitude of the reduction in the sampling rate between the second sampling rate during the high monitoring mode 30 and the fourth sampling rate during the post-event monitoring mode 50 may be determined based on the storage capacity of the data storage module 140, the power capacity of the internal power source 150, and/or the anticipated series of events which occur after the triggering event before the wearer reaches a position of safety. For example, in the case of an aircraft pilot ejection or crash event in an automobile race, the period of greatest interest and concern for the wearer of the event detection and recording system 100 occurs within the first approximately 15 seconds subsequent to the triggering event, thereby allowing for a reduction in sampling rate to extend the period of data collection.

In various embodiments, the event sensor 110 and the activity recording sensor 120 may be activated or deactivated depending on the needs during that particular operating mode. For example, in one or more embodiments, the event sensor 110 may be inactive during one or more of the deep sleep mode 40, the high monitoring mode 30, and the post-event monitoring mode 50 as there would be no need for immediate detection of the initiation of the triggering event 22. Similarly, in one or more embodiments, the activity recording sensor 120 may be inactive during the low monitoring mode 20 where the system 100 is focused on determination of initiation of the triggering event 22.

In one or more embodiments, the method of detecting an event and recording quantitative parameters associated with the event further comprises analyzing the high monitoring mode sensor data with the microcontroller 160 to verify the triggering event. Such action is represented as 36 in FIG. 2. Specifically, in order to initiate transition from low monitoring mode 20 to high monitoring mode 30 in an expeditious fashion to minimize likelihood of failing to record the quantitative data in the period immediately after the triggering event at the elevated sampling rate of the high monitoring mode 30, the microcontroller 160 may generate a false-positive regarding determination of the initiation of the triggering event. As such, the system 100 is capable of activating the high monitoring mode 30 and then verifying that the triggering event 36 occurred. Verification of the triggering event 36 may be made by the microcontroller 160 by analyzing additional quantitative parameters within the low monitoring mode sensor data or the high monitoring mode sensor data to confirm that they align with the expectation in the case of a true triggering event. It will additionally be appreciated that the activation of the high monitoring mode 30 may activate one or more additional sensors within the event detection and recording system 100 allowing for confirmation based on data not available at the time of initial microcontroller decision.

Upon verification of the triggering event 36, the microcontroller 160 may instruct the event detection and recording system 100 to continue operation in the anticipated manner. Specifically, operation in the high monitoring mode 30 may be continued to record the quantitative parameters of interest surrounding the triggering event with recording of the high monitoring mode sensor data until event completion 34.

In the event of failure to verify the triggering event, the microcontroller 160 may initiate a return to low rate monitoring mode 20. Further, in one or more embodiments, at least a portion of the low monitoring mode sensor data and high monitoring mode sensor data may be recorded in the data storage module 140 as a false positive data set as illustrated by 38 in FIG. 2. The false positive data set may be utilized, for analysis to update the programming in the microcontroller 160 to avoid future false positives. The false positive data set may also utilized as coverage in the case where the triggering event was indeed proper, but verification of the triggering event 36 incorrectly identified the determination of the triggering event as a false positive.

Figure 7:
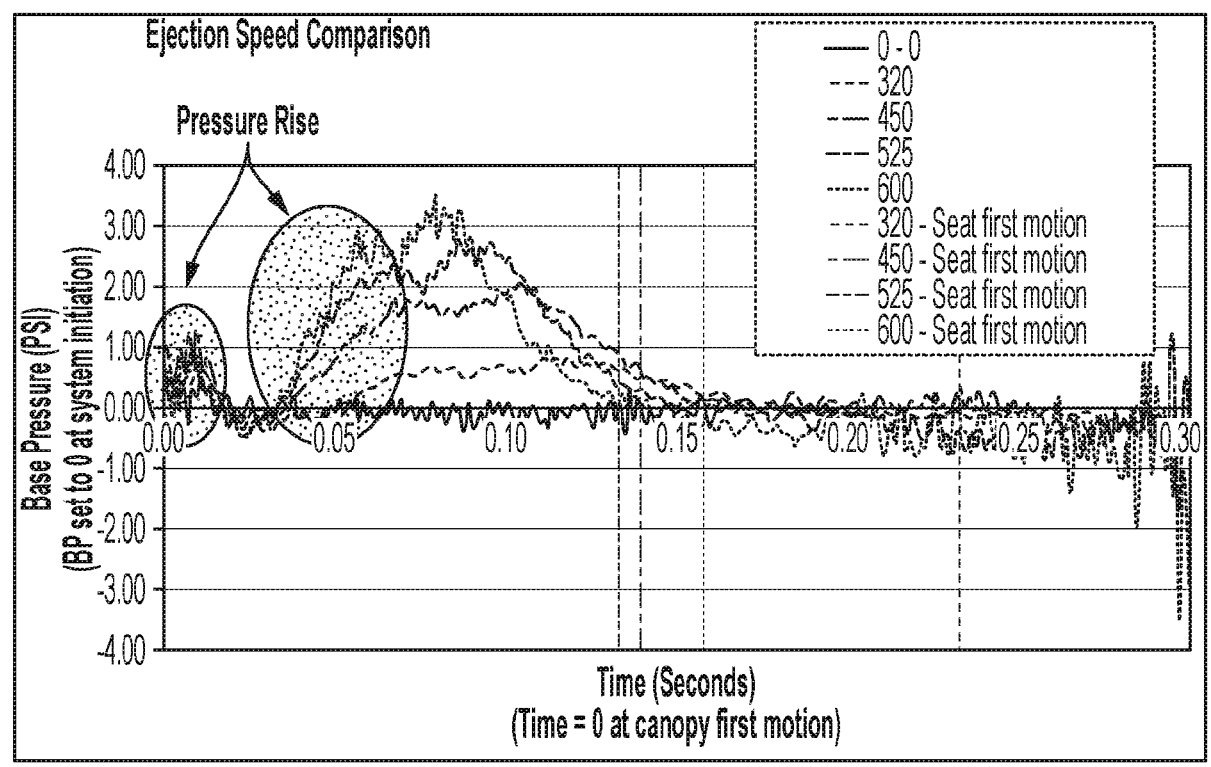
FIG. 7 is a graph illustrating pressure changes indicative of a triggering event in accordance with one or more embodiments of the present disclosure.
Figure 8:
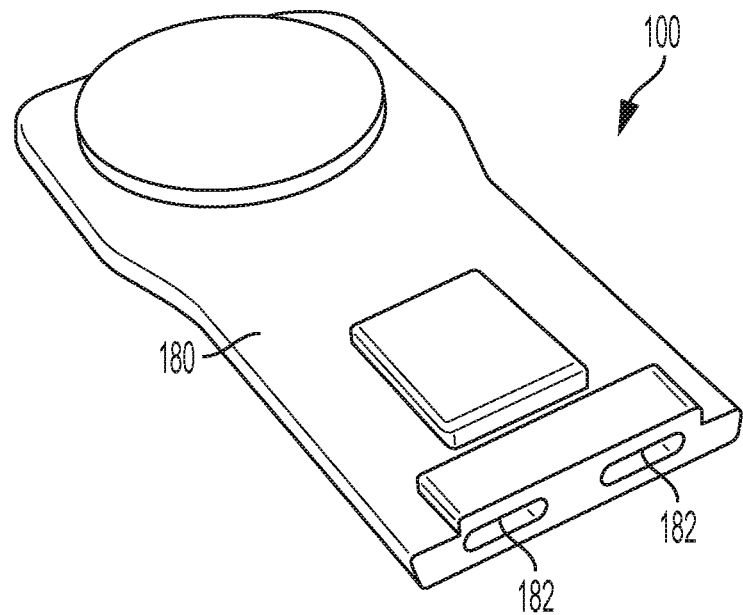
FIG. 8 is an illustration of an event detection and recording system in accordance with one or more embodiments of the present disclosure.
Figure 9:
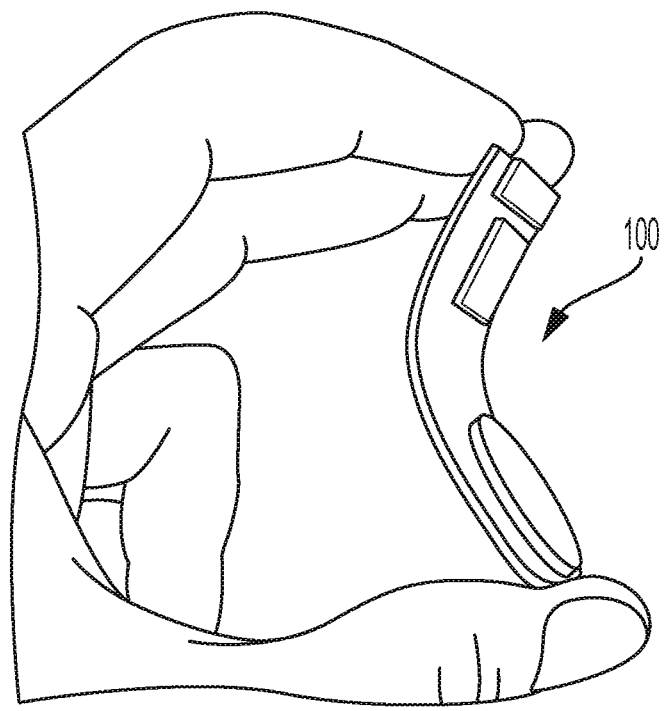
FIG. 9 is an illustration of the flexion of the event detection and recording system in accordance with one or more embodiments of the present disclosure.

For an embodiment of the event detection and recording system 100 implemented as a pilot ejection event monitoring system, the pressure change of the cockpit may be a primary trigger mechanism for determination of the triggering event, and acceleration data may be used as a secondary validation to reduce false positives. Here, the microcontroller monitors the cockpit pressure for a data set that corresponds to a predetermined data set indicative of an ejection. Using pressure change as the primary detection mechanism allows for reliable ejection detection very early on in the ejection sequence, triggering high rate data recording with activation of the high monitoring mode 30 before first seat motion. The acceleration data acquired during the high monitoring mode 30 may then be used to verify the triggering event as the motion of the pilot in a known manner as their seat is ejected from the aircraft would confirm the triggering event of the ejection. FIG. 7, illustrates test data obtained from simulated ejection events on an aircraft test sled. The distinct pressure rise attributed to canopy release is noted prior to first motion of the seat. The test data of FIG. 7 is provided for a series of 5 different speeds (0-0, 320, 450, 525, 600) of the aircraft test sled at the time of canopy release, with a greater number representing a higher speed.

In one or more embodiments, the event detection and recording system 100 further comprises at least one data transfer module 170. The at least one data transfer module 170 is an electronic component configured for transmission of data stored in the data storage module 140 to an external storage device (not shown). As such, the method of detecting an event and recording quantitative parameters associated with the event may further comprise transferring at least the low monitoring mode sensor data and the high monitoring mode sensor data stored in the data storage module to the external storage device 54. In one or more embodiments, the microcontroller 160 monitors for an export command to initiate data transfer from the data transfer module 170. In further embodiments, an operator may connect directly to the data storage module 140 to access the data stored on the memory therein.

The physical structure and components of the event detection and recording system 100 shall now be disclosed in greater detail with reference to FIGS. 3A, 3B, 4A, 4B, and 8. In one or more embodiments, a housing 180 which encloses the event detection and recording system 100 including the event sensor 110, the at least one activity recording sensor 120, the buffer memory 130, the data storage module 140, the at least one data transfer module 170, the internal power source 150, and the microcontroller 160. The event sensor 110 is configured to detect initiation of a triggering event and the at least one activity recording sensor 120 is configured to measure one or more quantitative parameters during the event. Further, the buffer memory 130 is configured to record an output of the event sensor 110 with the buffer memory 130 being periodically overwritten until detection of the triggering event, the data storage module 140 is configured to record and store the output of the event sensor 110 and the activity recording sensor 120, and the at least one data transfer module 170 is configured for transmission of data stored in one or both of the buffer memory 130 and the data storage module 140 to an external storage device.

In one or more embodiments, the microcontroller 160 is coupled to the event sensor 110, the activity recording sensor 120, the buffer memory 130, the data storage module 140, and the data transfer module 170 for control and direction of each component. Specifically, the microcontroller 160 may be configured to collect the output of the event sensor 110 and the activity recording sensor 120 as sensor values and monitor the sensor values from the event sensor 110 to determine initiation of the triggering event 22. Determination of the triggering event 22 may be based on an analysis of the sensor values from the event sensor 110 against reference values stored in the microcontroller 160. Further, the microcontroller 160 may be configured to adjust the sampling rate and power consumption of the event sensor 110, the activity recording sensor 120, or both the event sensor 110 and the activity recording sensor 120 based on the monitored sensor values. Upon determination that the triggering event has been initiated 22, the microcontroller 160 may transfer the sensor values stored in the buffer memory 130 to the data storage module 140 (step 32 of FIGS. 1 and 2) and initiate ongoing recordation of the sensor values to the data storage module 140 (step 34 of FIGS. 1 and 2) to retain sensor values before, during, and after the triggering event.

The microcontroller 160 is a compact integrated circuit designed to govern the specific operation of the event detection and recording system 110. One skilled in the art has familiarity with microcontrollers in general and is capable of selection of an appropriate microcontroller 160 for governing the specific operational guidelines of event detection and recording system 100. Examples of suitable microcontrollers 160 include those categorized as ultra-low power microcontrollers such as MSP430, TM4C123G, and CC1352 commercially from Texas Instruments (Dallas, Texas) or Pic32 commercially available from Microchip Technology Inc (Chandler, Arizona).

The event sensor 110 is provided as a component of the event detection and recording system 100 to detect initiation of the triggering event 22. The particular sensors included within the event sensor 110 may be selected based on the type of triggering event to be detected by the event sensor 110. For example, in the case of an aircraft pilot ejection, the event sensor 110 may comprise a pressure sensor which can record the distinct pressure change, attributed to canopy release, that is indicative of a pilot ejection very early in the event. Similarly, in the case of a helmet for an American football player or an auto racer, the event sensor 110 may comprise an accelerometer to record a drastic change in speed or direction that is indicative of contact with another player, racecar, or barrier.

In various embodiments, the event sensor 110 may comprise one or more of an Inertial Measurement Unit (IMU), a pressure sensor, an accelerometer, a gyroscope, and a temperature sensor. Examples of temperature sensors include a thermostat, a thermistor, a resistive temperature detector, or a thermocouple. It will be appreciated that an IMU is a sensor component which is made up of an accelerometer, gyroscope, and magnetometer.

The activity recording sensor 120 is provided as a component of the event detection and recording system 100 to measure one or more quantitative parameters during the event associated with the triggering event. The particular sensors included within the activity recording sensor 120 may be selected based on the type of triggering event and the expected quantitative parameters to be relevant during the event. For example, in the case of an aircraft pilot ejection, the activity recording sensor 120 may comprise an accelerometer to measure the acceleration experienced by the pilot both during the acceleration in the physical ejection from the aircraft as well as the deceleration from insertion into the surrounding air. Similarly, in the case of a helmet for an American football player or an auto racer, the activity recording sensor 120 may comprise an accelerometer to record measure changes in speed or direction resulting from contact with another player, the ground, another racecar, or a racecourse limits barrier. Recording the accelerations experienced by the wearer of the event detection and recording system 100 allows for analysis for treatment or diagnosis of potential injuries experienced during the event. When positioned in a helmet, the event detection and recording system 100 allows for analysis regarding potential neck or head injuries from rapid acceleration of the head.

In various embodiments, the activity recording sensor 120 may comprise one or more of an Inertial Measurement Unit, an accelerometer, and a gyroscope.

In one or more embodiments, the event sensor 110 and the activity recording sensor 120 include a single IMU, accelerometer, gyroscope, or both serving as both the event sensor 110 and the activity recording sensor 120. Specifically, where both the event sensor 110 and the activity recording sensor 120 rely upon measurement provided by an IMU, an accelerometer, or a gyroscope, a single instance of such as a shared sensor unit may be provided to avoid duplication of components within the event detection and recording system 100. It will be appreciated, and it is explicitly stated, that in one or more embodiments, the event sensor 110, the activity recording sensor 120, or both may comprise additional sensor units beyond the shared sensor unit.

In one or more embodiments with a temperature sensor included as the activity recording sensor 120 and/or the event sensor 110, the temperature sensor may be sensitive to a temperature range of -55° C. to 130° C., and preferably 25° C. to 45° C. with an accuracy of ± 0.05° C. or ± 1.5° C. In various embodiments, the temperature sensor may be provided in a package having a footprint of approximately 2 mm by 1.25 mm, 1.5 mm by 1.25 mm, or 1 mm by 1 mm. The temperature sensor may be a CMOS integrated-circuit temperature sensor such as the LM20 analog temperature sensor commercially available from Texas Instruments (Dallas, Texas).

In one or more embodiments with an accelerometer, gyroscope or IMU included as the activity recording sensor 120 and/or the event sensor 110, the accelerometer, gyroscope or IMU may be provided in a package having a footprint of approximately 1.6 mm by 1.6 mm or less than 3 square millimeters (mm²) or a volume of 2.5 mm by 3.0 mm by 0.83 mm. Potential sensors include a combination accelerometer and gyroscope such as the ISM330DLC commercially available from STMicroelectronics (Geneva, Switzerland). In one or more embodiments, the accelerometers may have an operational range of 0 to +/-100 times the acceleration of gravity (g) with a sampling frequency of 0.01 Hz to 2000 Hz. Example accelerometers include the KX134-1211 and KMX63-1055 commercially available from Kiomix (Ithaca, New York), ADXL356C commercially available from Analog Devices (Norwood, Massachusetts), and H3LIS331DL commercially available from STMicroelectronics. In one or more embodiments, the gyroscope may have an operational range of 0 to +/- 2000 degree/sec with a sampling frequency of 0.01 Hz to 2000 Hz. Example gyroscopes include BMG 250 commercially available from Bosch Sensortec GmbH (Reutlingen, GERMANY), FXAS21002CQR1 commercially available from NXP Semiconductors (Eindhoven, Netherlands), and ITG-3701 commercially available from IvenSense (San Jose, California).

In one or more embodiments with a pressure sensor included as the activity recording sensor 120 and/or the event sensor 110, pressure sensor may have an operational range of 1 to 20 psi. Example pressure sensors include the MS5840-02BA, MS5837-02BA, and MS5525DSO which are commercially available from TE Connectivity (Schaffhausen, Switzerland).

In one or more embodiments, the buffer memory 130 is provided as internal memory integral with the microprocessor 160. As previously indicated, the buffer memory 130 represents a computer hardware component which records the data stream of the low rate monitoring mode sensor data provided from the activity recording sensor 120, the event sensor 110, or both the activity recording sensor 120 and the event sensor 110. As such, the microcontroller 160 may comprise its own internal memory in the form of the buffer memory 130 which saves data in temporary storage that is being periodically overwritten before the triggering event occurs 22.

In one or more embodiments, the buffer memory 130 is provided as a separate memory component from the microprocessor 160 with recorded sensor data transmitted thereto from the microprocessor 160 for temporary storage. It will be appreciated that provision of a separate memory component for the buffer memory 130 allows for utilization of a standard microprocessor 160 across differing implementations of the event detection and recording system 100 while allowing the storage capacity or type of memory serving as the buffer memory 130 to vary to match the anticipated needs.

The buffer memory 130 may be provided as volatile or non-volatile memory. Examples of the types of memory which may be implemented as the buffer memory 130 include dynamic random-access memory (DRAM), static random-access memory (SRAM), ferroelectric random-access memory (FRAM), flash memory, or magnetic memory. In one or more embodiments, the buffer memory 130 may comprise FRAM with a capacity of at least 256 kilobytes (kB), at least 512 kB, at least 1024 kB (alternatively referenced as 1 megabyte (MB)), or at least 2 MB. The FRAM memory may be included as a component of the microcontroller 160. It will be appreciated that the capacity of the buffer memory 130 must be sufficient to record at least 10 to 15 seconds of sensor data for retention of sensor parameters prior to the triggering event 22.

The data storage module 140 provides a permanent storage location for sensor data acquired before, during, and after the triggering event. Specifically, the data storage module 140 is connected to the microcontroller 160 to receive sensor data for recordation and analysis subsequent to the triggering event. In one or more embodiments, the data storage module 140 may comprise non-volatile memory such as FRAM or magnetic memory. For example, the data storage module 140 may be the MX25R6435F FLASH memory commercially available from Macronix (Hsinchu, Taiwan). In various embodiments, the data storage module 140 may have a capacity of at least 4 MB, at least 8 MB, at least 16 MB, or at least 32 MB. It will be appreciated that the capacity of the data storage module 140 must be sufficient to record at least 10 to 15 seconds of sensor data for retention of sensor parameters subsequent to the triggering event 22 with retention of at least 5 minutes of data desired.

It will be appreciated that technological progression may change the nominal capacity and/or type of memory utilized for the buffer memory 130 and/or the data storage module 140 without deviating from the thrust of the present disclosure. Specifically, new types of volatile and non-volatile memory may be developed in future years which are cheaper, smaller, and/or more efficient and it is anticipated that such memory may be incorporated in the event detection and recording system 100 while maintaining the novel and inventive features of such system. Further, it will be appreciated that the necessary capacity of the buffer memory 130 and/or the data storage module 140 may be determined to be commensurate with that needed to record a sufficient time period of sensor data in accordance with the contemporary data storage and compression protocols when the event detection and recording system 100 is manufactured.

The data transfer module 170 provides transmission of data stored in the buffer memory 130, the data storage module 140, or both the buffer memory 130 and data storage module 140 to the external storage device. In various embodiments, the data transfer module 170 may operate in a wired or wireless manner. For example, the data transfer module 170 may comprise a wireless transmitter capable of wirelessly transmitting the data stored in the data storage module 170 using a known wireless data transfer protocol. Non-limiting examples of wireless data transfer protocols include Bluetooth and Wi-Fi (IEEE 802.11). The data transfer module 170 may also or alternatively be provided with a wired connection to the external storage device such as Universal Serial Bus (USB), FireWire (IEEE 1394), Ethernet, eSATA, and Thunderbolt connections. Such wired connections provide the capability to power the data transfer module 170 if necessary for the data transfer procedure.

It will be appreciated that in one or more embodiments, the disclosed event detection and recording system 100 is self-contained, requiring no external power. The internal power source 150 provides the electrical power for operation of the event detection and recording system 100 without the need for connection to an alternative source of power. In one or more embodiments, a low-profile battery serving as the internal power source 150 is provides as part of the event detection and recording system 100. Examples of low-profile batteries include button cell batteries and thin film batteries such as a thin film lithium battery. The internal power source 150 may be sized such that the event detection and recording system 100 is capable of operating for the scheduled lifetime of the event detection and recording system without replacement or recharging. In various embodiments, the scheduled lifetime of the event detection and recording system may be 1 week, 1 month, 6 months, 12 months, 18 months, or 24 months. It will be appreciated that the event detection and recording system 100 is described as not requiring replacement or recharging of the internal power source 150; however, embodiments with the capability to replace or recharge the internal power source 150 on a periodic basis are additionally envisioned.

It will be appreciated that the capacity, expressed in units such as milliAmp-hours (mAH), of the internal power source 150 may be selected to allow operation of the event detection and recording system 100 for the scheduled lifetime of the event detection and recording system. In one or more embodiments, the scheduled lifetime of the event detection and recording system may be at least 6 months, at least 1 year, at least 18 months, or at least 2 years. The internal power source 150 may be sized to provide a scheduled 100 to 400 mAH for each year of the planned scheduled lifetime. In one or more embodiments, the internal power source 150 may be sized to provide a scheduled 280 mAH for each year of the planned scheduled lifetime. As such, in various embodiments the internal power source 150 may have a capacity of at least 160 mAH, at least 280 mAH, 160 to 800 mAH, or 280 to 400 mAH.

In one or more embodiments, the event detection and recording system 100 may further comprise a power regulator 152 to control the power received from the internal power source 150.

In one or more embodiments, the event detection and recording system 100 may further comprise one or more signaling lights 190 indicating the status of the event detection and recording system 100 or one or more sub-components of the event detection and recording system 100. For example, the signaling lights 190 may provide indicia of the health or remaining capacity of the internal power source 150, the health or remaining capacity of the memory components of the event detection and recording system 100, and/or the status of the microcontroller 160. Additionally, the signaling lights 190 may indicate the current operational mode of the event detection and recording system 100. Specifically, the signaling lights 190 may indicate operation of the event detection and recording system 100 in the sleep mode 40, the low monitoring mode 20, high monitoring mode 30, post-event monitoring mode 50, or additional operating modes incorporated into the event detection and recording system 100. For example, the signaling lights 190 may appear a certain color or change color to indicate current battery level. Further, the signaling lights 190 may be illuminated in a flashing manner to indicate quantitative information, such as the number of false positives recorded.

In one or more embodiments, the signaling lights may comprise light-emitting diodes (LED). Further, in one or more embodiments, the signaling lights 190 may only be illuminated upon depression of a button 192 or toggling of a switch to conserve power.

With reference to FIGS. 3A, 3B, 5, and 8, in one or more embodiments, the housing 180 comprises an encapsulation with an elastomeric material. In various embodiments, the elastomeric material comprises silicone, thermoplastic polyurethane (TPU), or thermoplastic elastomer (TPE).

Encapsulation of the event sensor 110, the activity recording sensor 120, the buffer memory 130, the data storage module 140, the data transfer module 170, the internal power source 150, and the microcontroller 160 with the elastomeric material of the housing 180 provides protection to the various components of the event detection and recording system 100. Specifically, the housing 180 provides a barrier to protect the components of the event detection and recording system 100 from dirt, sweat and other moisture encountered during operational use. The housing 180 also provides protection against physical damage to the event detection and recording system 100 components from impacts or other forcible trauma encountered during rugged applications. Furthermore, the housing 180 may impart bending flexibility and compliance to the event detection and recording system 100 and allows for better fitting and positioning onto wearable equipment.

In one or more embodiments, the housing 180 comprises at least one opening 182 in the encapsulation with the elastomeric material to allow physical connection with one or more components of the detection and recording system 100. In various embodiments, the at least one opening 182 in the encapsulation may allow for physical access to the data transfer module 170, one or more of the activity recording sensors 120, the event sensor 110, the internal power source 150, or combinations thereof. For example, physical access to the data transfer module 170 allows for a hardwired connection thereto in addition to or in lieu of wireless transmission capabilities. Further, the activity recording sensors 120 and/or the event sensor 110 may include sensor types which require or are more accurate with a direct connection to the surrounding environment. For example, a pressure sensor or a temperature sensor may provide more accurate measurements when the surrounding environment may act directly upon the sensor without an attenuating effect from the elastomeric material of the encapsulation. It will be appreciated that an interface between the elastomeric material and the components of the detection and recording system at the terminus of the opening in the encapsulation may form a seal. In various embodiments, the seal may result from geometry of the interface or from a chemical sealant.

In one or more embodiments, the event detection and recording system 100 may further comprise a recharging port (not shown) accessible through the elastomeric encapsulation electrically connected to the internal power supply 150. The internal power supply 150 may be recharged through the recharging port using a power source external to the event detection and recording system 100 when the event detection and recording system 100 is not in use. The recharging port may comprise a standard interface, such as USB, 4-pin connectors, or single prong.

In one or more embodiments, the event detection and recording system 100 may further comprise a manual power switch 210 for powering up the event detection and recording system 100. Such arrangement allows for the event detection and recording system 100 to be stored in a fully powered off mode until ready to be activated for service.

In one or more embodiments, the event detection and recording system 100 may further comprise a wireless charging circuit (not shown) connected to the internal power source 150. The wireless charging circuit allows the internal power source 150 to be recharged while fully encapsulated within the elastomeric material. Charging with the wireless charging circuit may operate under the principles of inductive charging. Inductive charging uses an electromagnetic field to transfer energy using electromagnetic induction, the production of electricity across a magnetic field. An induction coil is used to create an alternating electromagnetic field from within a charging station (transmitter), and a second induction coil in the wireless charging circuit (receiver) receives power from the electromagnetic field, rectifies the voltage, and regulates electric current to charge the internal power source. Specifically, the two induction coils in proximity combine to form an electrical transformer.

In one or more embodiments and with reference to FIGS. 3A, 3B, 4A, and 4B, the event detection and recording system 100 further comprises a flexible circuit board 310 affixed to one or more rigid backing panels 312. The flexible circuit board 310 at positions aligned with the one or more rigid backing panels 312 support the various components of the event detection and recording system 100. Specifically, the activity recording sensor 120, the event sensor 110, the buffer memory 130, the data storage module 140, the data transfer module 170, the internal power source 150, and the microcontroller 160 may be affixed to flexible circuit board 310 at positions aligned with the one or more rigid backing panels 312 via electrical connections in accordance with techniques known to those skilled in the art. The encapsulation of the flexible circuit board 310 protects and secures the various components on the flexible circuit board 310 while retaining flexibility in the regions not aligned with the one or more rigid backing panels 312.

The combination of the flexible circuit board 310 and the one or more rigid backing panels 312 provides a stiff substrate for in the form of the rigid backing panels 312 for securement of the various components to the flexible circuit board 310 while maintaining flexibility in the remaining regions. It will be appreciated that maintaining the stiff substrate for affixing the various components of the event detection and recording system 100 to the flexible circuit board 310 by aligning the regions of affixation with the rigid backing panels 312 prevents delamination or peeling of the various components away from the flexible circuit board 310 as a resulting of flexion of the flexible circuit board 310. Further, the rigid backing panels 312 are capable of stress shielding the various components of the event detection and recording system 100 from flexion and breakage or cracking when the of the event detection and recording system 100 is flexed to conform to piece of equipment, such as the article of personal protective equipment 200, when placed into service.

In one or more embodiments, the flexible circuit board 310 comprises a flexible substrate with a metal trace 410 adhered on it. Alternatively, such flexible circuit board 310 may be made from a flexible conductive ink 420 printed on an elastomer substrate. For example, the flexible circuit board 310 may be formed with a polyimide or poly-ether-ether-ketone (PEEK) substrate which allows flexion of the flexible circuit board 310.

The electronic traces on the flexible circuit board 310 should be selected to withstand the flexion of flexible circuit board 310 during placement and utilization within the event detection and recording system 100. Specifically, in one or more embodiments, the electronic traces 410 may comprise a metallic foil encapsulated by a flexible polyimide overlay, thus making the electronic traces 410 capable of being repeatedly flexed without breakage. In various embodiments, the metallic foil forming the electronic traces 410 may comprise copper (Cu), gold (Au), silver (Ag), or platinum (Pt). In one or more embodiments, the flexible circuitry 400 may be formed with flexible/stretchable conductive inks 420. The conductive inks 420 may be applied in a wave-shape pattern to a stretchable substrate such as silicone, thermoplastic polyurethane (TPU), or thermoplastic elastomer (TPE). A commercially available stretchable electronic ink is the Intexar™ line of stretchable electronic inks from DuPont Microcircuit Materials (Research Triangle Park, NC).

Figure 5:
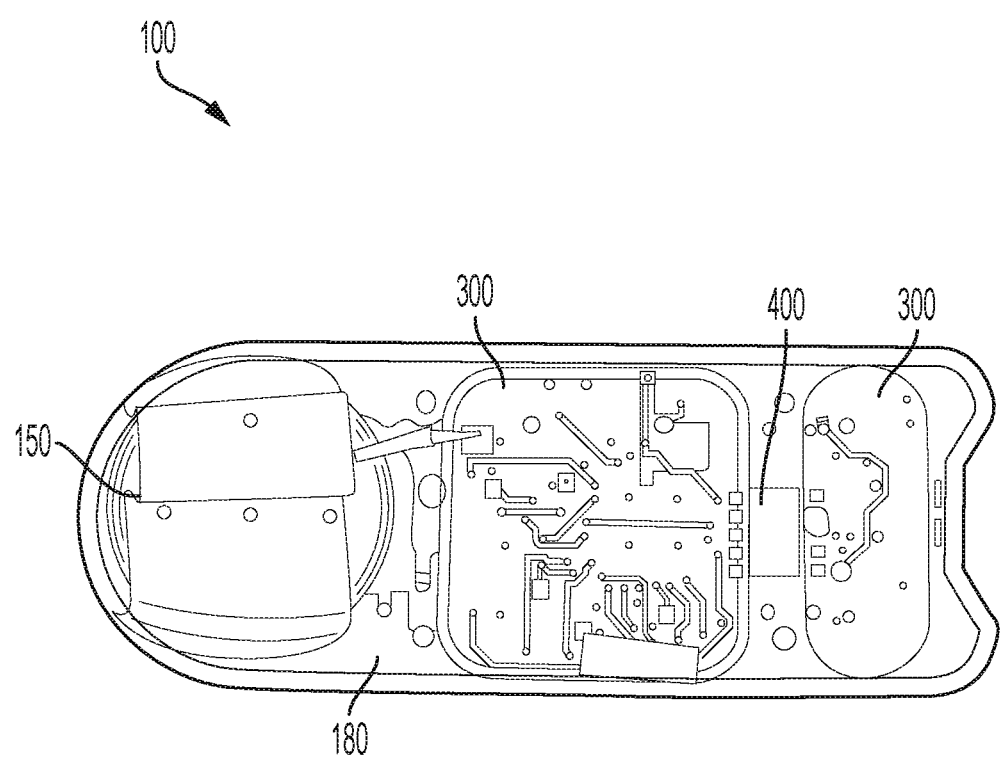
FIG. 5 is an illustration of an event detection and recording system comprising rigid circuit board components connected with flexible circuitry in accordance with one or more embodiments of the present disclosure.

In one or more embodiments and with reference to FIG. 5, the event detection and recording system 100 further comprises two or more rigid circuit board components 300 coupled with the encapsulation with the elastomeric material of the housing 180. The rigid circuit board components 300 may be formed from printed circuit boards as known to those skilled in the art. The rigid circuit board components 300 support the various components of the event detection and recording system 100. Specifically, the activity recording sensor 120, the event sensor 110, the buffer memory 130, the data storage module 140, the data transfer module 170, the internal power source 150, and the microcontroller 160 may be affixed to the rigid circuit board components 300 via electrical connections in accordance with techniques known to those skilled in the art. The encapsulation of the rigid circuit board components 300 with the elastomeric material allows the two or more rigid circuit board components 300 to be maintained as a single unit while allowing them to be flexed relative to each other.

In one or more embodiments, the rigid circuit board components 300 are connected with flexible circuitry 400. The flexible circuitry 400 forms electrical connections between the rigid circuit board components 300 and thereby allows transmission of electrical signals between one or more of the activity recording sensor 120, the event sensor 110, the buffer memory 130, the data storage module 140, the data transfer module 170, the internal power source 150, and the microcontroller 160 affixed to separate circuit board components 300. In one or more embodiments, the internal power supply 150 is affixed to a first circuit board and the sensors (activity recording and event sensors 120/110), microcontroller 160, memory (buffer memory 130 and the data storage module 140), and the data transfer module 170 are affixed to a second circuit board.

In one or more embodiments, the flexible circuitry 400 comprises a flexible substrate with a metal trace 410 adhered on it as disclosed with regards to the flexible circuit board 310. Specifically, in one or more embodiments, the electronic traces 410 may comprise a metallic foil encapsulated by a flexible polyimide overlay, thus making the electronic traces 410 capable of being repeatedly flexed without breakage. In one or more embodiments, the flexible circuitry 400 may be formed with flexible/stretchable conductive inks 420..

In one or more embodiments, the event detection and recording system 100 may further comprise a backing or other device to aid in affixing the system 100 to the piece of equipment, such as the personal protective equipment 200. For example, the event detection and recording system 100 may include an adhesive backing or a hook-and-loop type fastener (commonly known as Velcro). It will be appreciated that surface preparation in accordance with methods known to those skilled in the art may support the efforts to affix the event detection and recording system 100 to the personal protective equipment 200.

Having described various embodiments, it should be understood that the various aspects of the method of detecting an event and recording quantitative parameters associated with the event and the event detection and recording system utilized in performance of the same are described and such aspects may be utilized in conjunction with various other aspects.

In a first aspect, the disclosure provides a method of detecting an event and recording quantitative parameters associated with the event. The method comprises securing an event detection and recording system on a piece of equipment, the event detection and recording system comprising an event sensor, at least one activity sensor, a buffer memory, a data storage module, an internal power source, and a microcontroller. Further, the method comprises activating a low monitoring mode upon determination that the event detection and recording system has been placed into service, the low monitoring mode comprising measuring one or more quantitative parameters with the activity recording sensor, the event sensor, or both the activity recording sensor and the event sensor at a first sampling rate to generate low monitoring mode sensor data, wherein a sampling rate represents the temporal frequency of measurements; recording the low monitoring mode sensor data in the buffer memory; and analyzing the low monitoring mode sensor data with the microcontroller to detect initiation of a triggering event, where initiation of the triggering event is determined by comparing one or more measurements from the low monitoring sensor data with a predefined data set indicative of the triggering event. The method further comprises activating a high monitoring mode upon detection of the triggering event, the high monitoring mode comprising measuring one or more quantitative parameters with the activity recording sensor, the event sensor, or both the activity recording sensor and the event sensor at a second sampling rate to generate high monitoring mode sensor data, where the second sampling rate is greater than the first sampling rate; terminating the low monitoring mode and transferring the low monitoring mode sensor data to the data storage module upon detection of the triggering event; and recording the high monitoring mode sensor data to the data storage module. Further, the buffer memory is periodically overwritten until detection of the event, the data storage module comprises non-volatile memory, and the event detection and recording system is powered by the internal power source.

In a second aspect, the disclosure provides the method of the first aspect, in which the method further comprises measuring one or more quantitative parameters with the activity recording sensor, the event sensor, or both the activity recording sensor and the event sensor at a third sampling rate to generate sleep mode sensor data, where the first sampling rate is greater than the third sampling rate; and analyzing the sleep mode sensor data with the microcontroller to determine the event detection and recording system has been placed into service, wherein the activity recording sensor is operated at the third sampling rate during periods when the event detection and recording system has not been placed into service.

In a third aspect, the disclosure provides the method of the second aspect, in which the event sensor is inactive during periods when the event detection and recording system has not been placed into service.

In a fourth aspect, the disclosure provides the method of any of the first through third aspects, in which during the low monitoring mode, the event sensor measures one or more quantitative parameters at the first sampling rate In a fifth aspect, the disclosure provides the method of any of the first through fourth aspects, in which during the high monitoring mode, the activity recording sensor measures one or more quantitative parameters at the second sampling rate.

In a sixth aspect, the disclosure provides the method of the fifth aspect, in which the event sensor is inactive during the high monitoring mode.

In a seventh aspect, the disclosure provides the method of the method of any of the first through sixth aspects, in which the method further comprises activating a post-event monitoring mode at a predetermined timeframe subsequent to the triggering event, the post-event monitoring mode comprising measuring one or more quantitative parameters with the activity recording sensor, the event sensor, or both the activity recording sensor and the event sensor at a fourth sampling rate to generate post-event monitoring mode sensor data, where the fourth sampling rate is intermediate the first sampling rate and the second sampling rate.

In an eighth aspect, the disclosure provides the method of any of the first through seventh aspects, in which the method further comprises analyzing the high monitoring mode sensor data with the microcontroller to verify the triggering event.

In a ninth aspect, the disclosure provides the method of the eighth aspect, in which a failure to verify the triggering event initiates a return to the low rate monitoring mode and recording at least a portion of the low monitoring mode sensor data and high monitoring mode sensor data in the data storage module as a false positive data set.

In a tenth aspect, the disclosure provides the method of any of the first through ninth aspects, in which the event detection and recording system further comprises at least one data transfer module, the at least one data transfer module being configured for transmission of data stored in the data storage module to an external storage device, and the method further comprises transferring at least the low monitoring mode sensor data and the high monitoring mode sensor data stored in the data storage module to the external storage device.

In an eleventh aspect, the disclosure provides the method of any of the first through tenth aspects, in which the event sensor is an Inertial Measurement Unit, a pressure sensor, an accelerometer, a gyroscope, or a temperature sensor.

In a twelfth aspect, the disclosure provides the method of any of the first through eleventh aspects, in which the activity recording sensor is an Inertial Measurement Unit, an accelerometer, or gyroscope.

In a thirteenth aspect, the disclosure provides the method of the tenth aspect, in which the data transfer module comprises a wireless transmitter.

In a fourteenth aspect, the disclosure provides the method of any of the first through thirteenth aspects, in which the piece of equipment is an article of personal protective equipment.

In a fifteenth aspect, the disclosure provides an event detection and recording system, the system. The system comprising an event sensor configured to detect initiation of a triggering event; at least one activity recording sensor configured to measure one or more quantitative parameters during the event; a buffer memory configured to record an output of the event sensor, the activity recording sensor, or both the activity recording sensor and the event sensor, where the buffer memory is periodically overwritten until detection of the triggering event; a data storage module configured to record and store the output of the event sensor and the activity recording sensor, the data storage module comprising non-volatile memory; at least one data transfer module configured for transmission of data stored in the buffer memory, the data storage module, or both the buffer memory and data storage module to an external storage device; an internal power source; and a microcontroller coupled to the event sensor, the activity recording sensor, the buffer memory, the data storage module, and the data transfer module. Further, the microcontroller is configured to: collect the output of the event sensor and the activity recording sensor as sensor values; monitor the sensor values from the event sensor and determine initiation of the triggering event based on an analysis of the sensor values from the event sensor against reference values stored in the microcontroller; adjust the sampling rate and power consumption of the event sensor, the activity recording sensor, or both the event sensor and the activity recording sensor based on the monitored sensor values, wherein the sampling rate represents the temporal frequency of measurements; and transfer the sensor values stored in the buffer memory to the data storage module upon determination of initiation of the triggering event and initiate ongoing recordation of the sensor values to the data storage module to retain sensor values before, during, and after the triggering event. Additionally, the event sensor, the activity recording sensor, the buffer memory, the data storage module, the data transfer module, the internal power source, and the microcontroller are disposed in a housing.

In a sixteenth aspect, the disclosure provides the system of the fifteenth aspect, in which the event sensor and/or activity recording sensor operates in a low monitoring mode with a first sampling rate and a high monitoring mode with a second sampling rate, the second sampling rate greater than the first sampling rate.

In a seventeenth aspect, the disclosure provides the system of the sixteenth aspect, in which the event sensor and/or activity recording sensor additionally operates in a deep sleep mode with a third sampling rate, the first sampling rate greater than the third sampling rate, with the deep sleep mode operating during periods of inactivity of the system.

In an eighteenth aspect, the disclosure provides the system of the sixteenth or seventeenth aspects, in which the low monitoring mode operates during periods when the system senses one or more initiation stimuli indicative of placement of the system in active service.

In a nineteenth aspect, the disclosure provides the system of any of the sixteenth through eighteenth aspects, in which the high monitoring mode operates during a period immediately subsequent to determination of initiation of the triggering event.

In a twentieth aspect, the disclosure provides the system of any of the sixteenth through nineteenth aspects, in which the event sensor and/or activity recording sensor additionally operates in a post-event monitoring mode with a fourth sampling rate, the fourth sampling rate intermediate the first sampling rate and the second sampling rate.

In a twenty-first aspect, the disclosure provides the system of any of the fifteenth through twentieth aspects, in which the housing comprises an encapsulation with an elastomeric material.

In a twenty-second aspect, the disclosure provides the system of the twenty-first aspect, in which the housing comprises at least one opening in the encapsulation to allow physical connection with the data transfer module and/or access to one or more of the activity recording sensors and/or access to the event sensor.

In a twenty-third aspect, the disclosure provides the system of any of the fifteenth through twenty-second aspects, in which the system further comprises a flexible circuit board affixed to one or more rigid backing panels; wherein the event sensor, the activity recording sensor, the buffer memory, the data storage module, the data transfer module, and the microcontroller are electrically affixed to the flexible circuit board at positions aligned with the one or more rigid backing panels.

In a twenty-fourth aspect, the disclosure provides the system of the twenty-first or twenty-second aspects, in which the system further comprises two or more rigid circuit board components coupled with the encapsulation with the elastomeric material such that the two or more rigid circuit board components may be flexed relative to each other; wherein the event sensor, the activity recording sensor, the buffer memory, the data storage module, the data transfer module, the microcontroller, and the internal power source are electrically affixed to the rigid circuit board components.

In a twenty-fifth aspect, the disclosure provides the system of the twenty-fourth aspect, in which the circuit board components are connected with flexible circuitry.

In a twenty-sixth aspect, the disclosure provides the system of any of the fifteenth through twenty-fifth aspects, in which the internal power source is a coin cell battery.

In a twenty-seventh aspect, the disclosure provides the system of any of the fifteenth through twenty-sixth aspects, in which the buffer memory is integral with the microprocessor.

In a twenty-eighth aspect, the disclosure provides the system of any of the fifteenth through twenty-seventh aspects, in which the event sensor is an Inertial Measurement Unit, a pressure sensor, an accelerometer, a gyroscope, or a temperature sensor.

In a twenty-ninth aspect, the disclosure provides the system of any of the fifteenth through twenty-eighth aspects, in which the activity recording sensor is an Inertial Measurement Unit, an accelerometer, or a gyroscope.

In a thirtieth aspect, the disclosure provides the system of any of the fifteenth through twenty-ninth aspects, in which the event sensor and the activity recording sensor include a single sensor unit with a single Inertial Measurement Unit, accelerometer, gyroscope, or both serving as both the event sensor and the activity recording sensor.

In a thirty-first aspect, the disclosure provides the system of any of the fifteenth through thirtieth aspects, in which the system further comprises one or more signaling lights indicating the status of the system or one or more sub-components of the system.

In a thirty-second aspect, the disclosure provides the system of any of the fifteenth through thirty-first aspects, in which the data transfer module comprises a wireless transmitter.

In a thirty-third aspect, the disclosure provides the method of any of the first through fourteenth aspects, in which the article of personal protective equipment is a helmet.

It should be apparent to those skilled in the art that various modifications and variations may be made to the embodiments described within without departing from the spirit and scope of the claimed subject matter. Thus, it is intended that the specification cover the modifications and variations of the various embodiments described within provided such modification and variations come within the scope of the appended claims and their equivalents.

As used throughout, the singular forms "a," "an" and "the" include plural referents unless the context clearly dictates otherwise. Thus, for example, reference to "a" component includes aspects having two or more such components, unless the context clearly indicates otherwise.

Optional or optionally means that the subsequently described event or circumstances may or may not occur. The description includes instances where the event or circumstance occurs and instances where it does not occur.

It should be understood that any two quantitative values assigned to a property or measurement may constitute a range of that property or measurement, and all combinations of ranges formed from all stated quantitative values of a given property or measurement are contemplated in this disclosure.

As used here and in the appended claims, the words "comprise," "has," and "include" and all grammatical variations thereof are each intended to have an open, non-limiting meaning that does not exclude additional elements or steps.

Having described the subject matter of the present disclosure in detail and by reference to specific embodiments thereof, it is noted that the various details disclosed within should not be taken to imply that these details relate to elements that are essential components of the various embodiments described within, even in cases where a particular element is illustrated in each of the drawings that accompany the present description. Further, it should be apparent that modifications and variations are possible without departing from the scope of the present disclosure, including, but not limited to, embodiments defined in the appended claims. More specifically, although some aspects of the present disclosure are identified as particularly advantageous, it is contemplated that the present disclosure is not necessarily limited to these aspects.

What is claimed is:

1. A method of detecting an event and recording quantitative parameters associated with the event, the method comprising:
    securing an event detection and recording system on a piece of equipment, the event detection and recording system comprising an event sensor, at least one activity recording sensor, a buffer memory, a data storage module, an internal power source, and a microcontroller;
    activating a low monitoring mode upon determination that the event detection and recording system has been placed into service, the low monitoring mode comprising measuring one or more quantitative parameters with at least one of the activity recording sensor and the event sensor at a first sampling rate to generate low monitoring mode sensor data, wherein a sampling rate represents a temporal frequency of measurements;

recording the low monitoring mode sensor data in the buffer memory;
analyzing the low monitoring mode sensor data with the microcontroller to detect initiation of a triggering event, where initiation of the triggering event is determined by comparing one or more measurements from the low monitoring sensor data with a predefined data set indicative of the triggering event;
activating a high monitoring mode upon detection of the triggering event, the high monitoring mode comprising measuring one or more quantitative parameters with at least one of the activity recording sensor and the event sensor at a second sampling rate to generate high monitoring mode sensor data, where the second sampling rate is greater than the first sampling rate;
terminating the low monitoring mode and transferring the low monitoring mode sensor data to the data storage module upon detection of the triggering event; and
recording the high monitoring mode sensor data to the data storage module; where,
the buffer memory is periodically overwritten until detection of the event,
the data storage module comprises non-volatile memory, and
the event detection and recording system is powered by the internal power source.

2. The method of claim 1, wherein the method further comprises measuring one or more quantitative parameters with the activity recording sensor, the event sensor, or both the activity recording sensor and the event sensor at a third sampling rate to generate sleep mode sensor data, where the first sampling rate is greater than the third sampling rate; and
analyzing the sleep mode sensor data with the microcontroller to determine the event detection and recording system has been placed into service,
wherein the activity recording sensor is operated at the third sampling rate during periods when the event detection and recording system has not been placed into service.

3. The method of claim 2, wherein the event sensor is inactive during periods when the event detection and recording system has not been placed into service.

4. The method of claim 1, wherein during the low monitoring mode, the event sensor measures one or more quantitative parameters at the first sampling rate.

5. The method of claim 1, wherein during the high monitoring mode, the activity recording sensor measures one or more quantitative parameters at the second sampling rate.

6. The method of claim 5, wherein the event sensor is inactive during the high monitoring mode.

7. The method of claim 1, wherein the method further comprises activating a post-event monitoring mode at a predetermined timeframe subsequent to the triggering event, the post-event monitoring mode comprising measuring one or more quantitative parameters with the activity recording sensor, the event sensor, or both the activity recording sensor and the event sensor at a fourth sampling rate to generate post-event monitoring mode sensor data, where the fourth sampling rate is intermediate the first sampling rate and the second sampling rate.

8. The method of claim 1, wherein the method further comprises analyzing the high monitoring mode sensor data with the microcontroller to verify the triggering event.

9. The method of claim 8, wherein a failure to verify the triggering event initiates a return to the low rate monitoring mode and recording at least a portion of the low monitoring mode sensor data and high monitoring mode sensor data in the data storage module as a false positive data set.

10. The method of claim 1, wherein the event detection and recording system further comprises at least one data transfer module, the at least one data transfer module being configured for transmission of data stored in the data storage module to an external storage device, and
the method further comprises transferring at least the low monitoring mode sensor data and the high monitoring mode sensor data stored in the data storage module to the external storage device.

11. The method of claim 1, wherein the piece of equipment is an article of personal protective equipment.

12. An event detection and recording system, the system comprising:
an event sensor configured to detect initiation of a triggering event;
at least one activity recording sensor configured to measure one or more quantitative parameters during the event;
a buffer memory configured to record an output of the event sensor, the activity recording sensor, or both the activity recording sensor and the event sensor, where the buffer memory is periodically overwritten until detection of the triggering event;
a data storage module configured to record and store the output of the event sensor and the activity recording sensor, the data storage module comprising non-volatile memory;
at least one data transfer module configured for transmission of data stored in the buffer memory, the data storage module, or both the buffer memory and data storage module to an external storage device;
an internal power source; and
a microcontroller coupled to the event sensor, the activity recording sensor, the buffer memory, the data storage module, and the data transfer module, the microcontroller configured to:
collect the output of the event sensor and the activity recording sensor as sensor values;
monitor the sensor values from the event sensor and determine initiation of the triggering event based on an analysis of the sensor values from the event sensor against reference values stored in the microcontroller;
adjust the sampling rate and power consumption of the event sensor, the activity recording sensor, or both the event sensor and the activity recording sensor based on the monitored sensor values, wherein the sampling rate represents the temporal frequency of measurements; and
transfer the sensor values stored in the buffer memory to the data storage module upon determination of initiation of the triggering event and initiate ongoing recordation of the sensor values to the data storage module to retain sensor values before, during, and after the triggering event;
wherein the event sensor, the activity recording sensor, the buffer memory, the data storage module, the data transfer module, the internal power source, and the microcontroller are disposed in a housing.

13. The system of claim 12, wherein the housing comprises an encapsulation with an elastomeric material.

14. The system of claim 13, the system further comprising a flexible circuit board affixed to one or more rigid backing panels;
wherein the event sensor, the activity recording sensor, the buffer memory, the data storage module, the data transfer module, and the microcontroller are electrically affixed to the flexible circuit board at positions aligned with the one or more rigid backing panels.

15. The system of claim 13, the system further comprising two or more rigid circuit board components coupled with the encapsulation with the elastomeric material such that the two or more rigid circuit board components may be flexed relative to each other;
   wherein the event sensor, the activity recording sensor, the buffer memory, the data storage module, the data transfer module, the microcontroller, and the internal power source are electrically affixed to the rigid circuit board components.

16. The system of claim 15, wherein the circuit board components are connected with flexible circuitry.

17. The system of claim 12, wherein the internal power source is a coin cell battery.

18. The system of claim 12, wherein the buffer memory is integral with the microprocessor.

19. The system of claim 12, wherein the event sensor is an Inertial Measurement Unit, a pressure sensor, an accelerometer, a gyroscope, or a temperature sensor.

20. The system of claim 12, wherein the activity recording sensor is an Inertial Measurement Unit, an accelerometer, or a gyroscope.

21. The system of claim 12, wherein the system further comprises one or more signaling lights indicating the status of the system or one or more sub-components of the system.

22. The system of claim 13, wherein the housing comprises at least one opening in the encapsulation to allow physical connection with the data transfer module, access to one or more of the activity recording sensors, and access to the event sensor.

23. The system of claim 12, wherein the data transfer module comprises a wireless transmitter.

* * * * *